United States Patent
Ahn et al.

(10) Patent No.: US 12,471,441 B2
(45) Date of Patent: Nov. 11, 2025

(54) ELECTROLUMINESCENCE DISPLAY

(71) Applicant: LG Display Co., Ltd., Seoul (KR)

(72) Inventors: JiYoung Ahn, Paju-si (KR); Yongjae Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 477 days.

(21) Appl. No.: 17/966,590

(22) Filed: Oct. 14, 2022

(65) Prior Publication Data
US 2023/0132497 A1    May 4, 2023

(30) Foreign Application Priority Data

Nov. 2, 2021   (KR) .................. 10-2021-0149024
Dec. 31, 2021  (KR) .................. 10-2021-0194500

(51) Int. Cl.
| | | |
|---|---|---|
| H10K 50/86 | (2023.01) | |
| H10K 50/856 | (2023.01) | |
| H10K 50/858 | (2023.01) | |
| H10K 59/131 | (2023.01) | |
| H10K 102/00 | (2023.01) | |

(52) U.S. Cl.
CPC ......... *H10K 50/865* (2023.02); *H10K 50/856* (2023.02); *H10K 50/858* (2023.02); *H10K 59/131* (2023.02); *H10K 2102/00* (2023.02)

(58) Field of Classification Search
None
See application file for complete search history.

(56) References Cited

U.S. PATENT DOCUMENTS

| | | |
|---|---|---|
| 9,082,997 B2 | 7/2015 | Baek et al. |
| 9,293,737 B2 | 3/2016 | Baek et al. |
| 9,306,190 B2 | 4/2016 | Kim et al. |
| (Continued) | | |

FOREIGN PATENT DOCUMENTS

| | | |
|---|---|---|
| CN | 105789247 A | 7/2016 |
| EP | 3331022 A1 | 6/2018 |
| (Continued) | | |

OTHER PUBLICATIONS

KR-20160008020-A Machine translation (Year: 2016).*
The Japan Patent Office, Office Action, Japanese Patent Application No. 2022-170796, Oct. 3, 2023, 14 pages.
Intellectual Property Office of the United Kingdom, Office Action, GB Patent Application No. 2215468.6, Apr. 20, 2023, seven pages.

(Continued)

*Primary Examiner* — Erik Kielin
(74) *Attorney, Agent, or Firm* — Fenwick & West LLP

(57) ABSTRACT

The present disclosure relates to an electroluminescence display having enhanced display quality by reducing reflection of external light. An electroluminescence display comprises: a light shielding layer on a substrate, the light shielding layer including a first metal layer and a second metal layer on the first metal layer; a first buffer layer at least partially covering the light shielding layer on the substrate; a second buffer layer on the first buffer layer; a gate insulating layer on the second buffer layer; a gate line on the gate insulating layer and non-overlapping with the light shielding layer, the gate line including a third metal layer and a fourth metal layer on the third metal layer; a passivation layer at least partially covering the gate line; a planarization layer on the passivation layer; and an emission element including a first electrode, an emission layer, and a second electrode sequentially arranged on the planarization layer.

19 Claims, 7 Drawing Sheets

(56) References Cited

U.S. PATENT DOCUMENTS

| | | | |
|---|---|---|---|
| 9,954,043 B2 | 4/2018 | Park et al. | |
| 10,475,868 B2 | 11/2019 | Park et al. | |
| 2009/0135102 A1* | 5/2009 | Park | H10K 59/131 |
| | | | 345/76 |
| 2014/0284563 A1 | 9/2014 | Baek et al. | |
| 2015/0303407 A1 | 10/2015 | Baek et al. | |
| 2016/0049426 A1 | 2/2016 | Lim et al. | |
| 2016/0049615 A1 | 2/2016 | Kim et al. | |
| 2017/0125492 A1* | 5/2017 | Kim | H10K 50/865 |
| 2017/0194404 A1 | 7/2017 | Park et al. | |
| 2017/0373282 A1 | 12/2017 | Kim et al. | |
| 2018/0062274 A1 | 3/2018 | Madsen et al. | |
| 2018/0108870 A1* | 4/2018 | Lee | H10K 59/8791 |
| 2018/0123078 A1 | 5/2018 | Byun et al. | |
| 2018/0204896 A1 | 7/2018 | Park et al. | |
| 2021/0249495 A1* | 8/2021 | Lee | H10K 59/8792 |

FOREIGN PATENT DOCUMENTS

| | | | |
|---|---|---|---|
| JP | 2014-183038 A | | 9/2014 |
| KR | 10-2010-0051485 A | | 5/2010 |
| KR | 10-2011-0066760 A | | 6/2011 |
| KR | 20160008020 A | * | 1/2016 |
| KR | 10-2016-0056390 A | | 5/2016 |
| KR | 10-2021-0072953 A | | 6/2021 |
| KR | 10-2021-0077279 A | | 6/2021 |
| TW | 201724616 | | 7/2017 |
| WO | WO 03/049210 A1 | | 6/2003 |

OTHER PUBLICATIONS

Taiwan Intellectual Property Office, Office Action, Taiwanese Patent Application No. 111140719, Sep. 23, 2023, 40 pages.
German Patent and Trademark Office, Office Action, German Patent Application No. 102022128408.5, Sep. 9, 2025, 22 pages.

* cited by examiner

ELECTROLUMINESCENCE DISPLAY

CROSS-REFERENCE TO RELATED APPLICATIONS

This application claims the benefit of the Republic of Korea Patent Application No. 10-2021-0149024 filed on Nov. 2, 2021, and the Republic of Korea Patent Application No. 10-2021-0194500 filed on Dec. 31, 2021, each of which is hereby incorporated by reference in its entirety.

BACKGROUND

Field of Technology

The present disclosure relates to an electroluminescence display having enhanced display quality by reducing reflection of external light. Especially, the present disclosure relates to a bottom emission type electroluminescence display having an external light reflection suppressing structure using the optical properties of a buffer layer disposed under the cathode electrode and various line layers.

Discussion of the Related Art

Recently, various type of display such as the cathode ray tubes (CRTs), the liquid crystal displays (LCDs), the plasma display panels (PDPs) and the electroluminescent displays have been developed. These various types of display are used to display image data of various products such as computer, mobile phones, bank deposit and withdrawal devices (ATMs), and vehicle navigation systems according to their unique characteristics and purposes.

In the electroluminescence display that is a self-luminous display device with excellent display quality, an external light reflection suppressing structure can be accomplished by disposing a polarization element in front of the display panel. The polarization element may lower the reflection ratio (or reflectance) of the entire surface of the display device by using the phase-change characteristics due to polarization and reflection as passing through the polarization element. It is possible to ensure a clearness of pure black, and a high contrast ratio may be acquired. However, about 55% of the light provided by the electroluminescence display device is lost due to the use of the polarization element. Because of the characteristics of the polarization element, the transmittance is about 45%. As the polarization element may absorb more than half of the light amount emitted from the electroluminescence element, this may be resulted to a problem in terms of efficiency. Further, since the polarization element is an expensive element, it also negatively affects to the manufacturing cost competitiveness of the display device. Accordingly, there is a demand for the development of a structure for an electroluminescence display capable of suppressing the external light reflection without adding a polarization element.

SUMMARY

The purpose of the present disclosure, as for solving the problems described above, is to provide an electroluminescence display having a low reflection cathode electrode capable of reducing display quality deterioration due to the reflection of the external light by the cathode electrode. Another purpose of the present disclosure is to provide an electroluminescence display having a low-reflection line and low-reflection cathode electrode, in addition to the cathode electrode, it is possible to reduce the display quality from being deteriorated due to the reflection of the external light by various lines or wirings formed of the metal materials. Still another purpose of the present disclosure is to provide an electroluminescence display having a structure capable of suppressing external light reflection caused by stacking of other thin film layers even with a device having a low reflection structure.

In one embodiment, an electroluminescence display comprises: a light shielding layer on a substrate, the light shielding layer including a first metal layer and a second metal layer on the first metal layer; a first buffer layer at least partially covering the light shielding layer on the substrate; a second buffer layer on the first buffer layer; a gate insulating layer on the second buffer layer; a gate line on the gate insulating layer and non-overlapping with the light shielding layer, the gate line including a third metal layer and a fourth metal layer on the third metal layer; a passivation layer at least partially covering the gate line; a planarization layer on the passivation layer; and an emission element including a first electrode, an emission layer, and a second electrode sequentially arranged on the planarization layer.

In one embodiment, an electroluminescence display comprises: a light shielding layer on a substrate, the light shielding layer including a plurality of first reflective layers, wherein light reflected by each of the plurality of first reflective layers have opposite phases such that the light reflected by the plurality of first reflective layers at least partially destructively interfere; a plurality of buffer layers on the light shielding layer; a gate insulating layer on the plurality of buffer layers; a gate line on the gate insulating layer and non-overlapping with the light shielding layer, the gate line including a plurality of second reflective layers, wherein light reflected by each of the plurality of second reflective layers have opposite phases such that the light reflected by the plurality of second reflective layers at least partially destructively interfere; a passivation layer at least partially covering the gate line; a planarization layer on the passivation layer; and an emission element including a first electrode, an emission layer, and a second electrode sequentially arranged on the planarization layer.

As the result, the external light reflection may be remarkably suppressed or reduced, the contrast ratio may be enhanced, and the video quality may be improved. Furthermore, without the polarization element which is relatively expensive cost, the price of the display device and the cost for manufacturing the display device may be saved.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
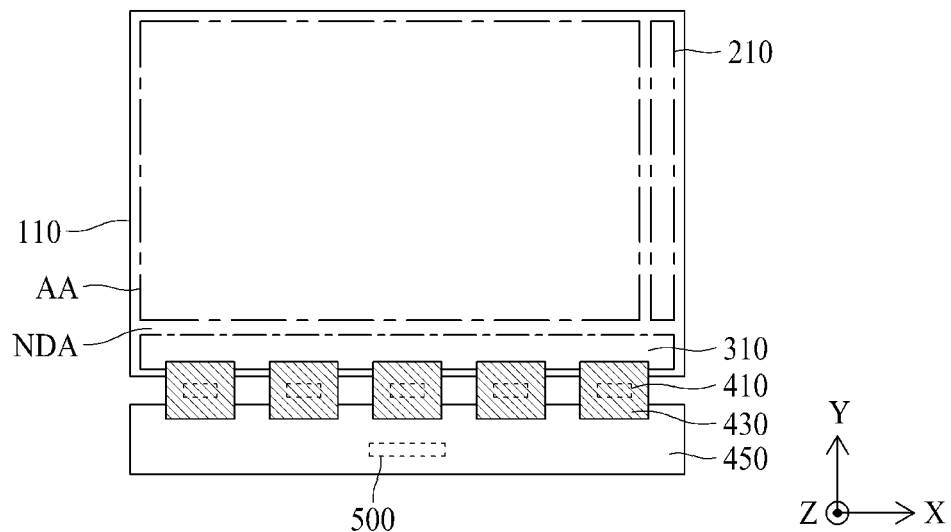
FIG. 1 is a plane view illustrating a schematic structure of an electroluminescence display according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween. Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the scale shown in the drawings.

Hereinafter, referring to the attached figures, the present disclosure will be explained. FIG. 1 is a plane view illustrating a schematic structure of an electroluminescence display according to the present disclosure. In FIG. 1, X-axis refers to the direction parallel to the scan line, Y-axis refers to the direction of the data line, and Z-axis refers to the height direction of the display device.

Referring to FIG. 1, the electroluminescence display comprises a substrate 110, a gate (or scan) driver 210, a data pad portion 310, a source driving IC (Integrated Circuit) 410, a flexible film 430, a circuit board 450, and a timing controller 500.

The substrate 110 may include an electrical insulating material and/or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The display area AA, which is an area for representing the video images, may be defined as the majority middle area of the substrate 110, but it is not limited thereto. In the display area AA, a plurality of scan lines (or gate lines), a plurality of data lines and a plurality of pixels may be formed or disposed. Each of pixels may include a plurality of sub pixels. Each of sub pixels includes the scan line and the data line, respectively.

The non-display area NDA, which is an area not representing the video images, may be defined at the circumference areas of the substrate 110 surrounding all or some of the display area AA. In the non-display area NDA, the gate driver 210 and the data pad portion 310 may be formed or disposed.

The gate driver 210 may supply the scan (or gate) signals to the scan lines according to the gate control signal received from the timing controller 500. The gate driver 210 may be formed at the non-display area NDA at any one outside of the display area AA on the substrate 110, as a GIP (Gate driver In Panel) type. GIP type means that the gate driver 210 is directly formed on the substrate 110.

The data pad portion 310 may supply the data signals to the data line according to the data control signal received from the timing controller 500. The data pad portion 310 may be made as a driver chip and mounted on the flexible film 430. Further, the flexible film 430 may be attached at the non-display area NDA at any one outside of the display area AA on the substrate 110, as a TAB (tape automated bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible film 430 as a COF (chip on film) or COP (chip on plastic) type.

The flexible film 430 may include a plurality of first link lines connecting the data pad portion 310 to the source driving IC 410, and a plurality of second link lines connecting the data pad portion 310 to the circuit board 450. The flexible film 430 may be attached on the data pad portion 310 using an anisotropic conducting film, so that the data pad portion 310 may be connected to the first link lines of the flexible film 430.

The circuit board 450 may be attached to the flexible film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 210 and a source control signal for controlling the source driving IC 410, based on the timing signal. The timing controller 500 may supply the gate control signal to the gate driver 210 and supply the source control signal to the source driving IC 410. Depending on the product types, the timing controller 500 may be formed as one chip with the source driving IC 410 and mounted on the substrate 110.

Figure 2:
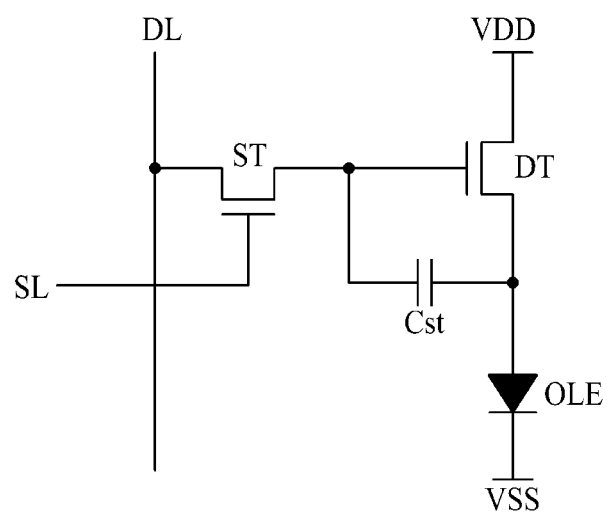
FIG. 2 is a circuit diagram illustrating a structure of one pixel included in the electroluminescence display according to the present disclosure.
Figure 3:
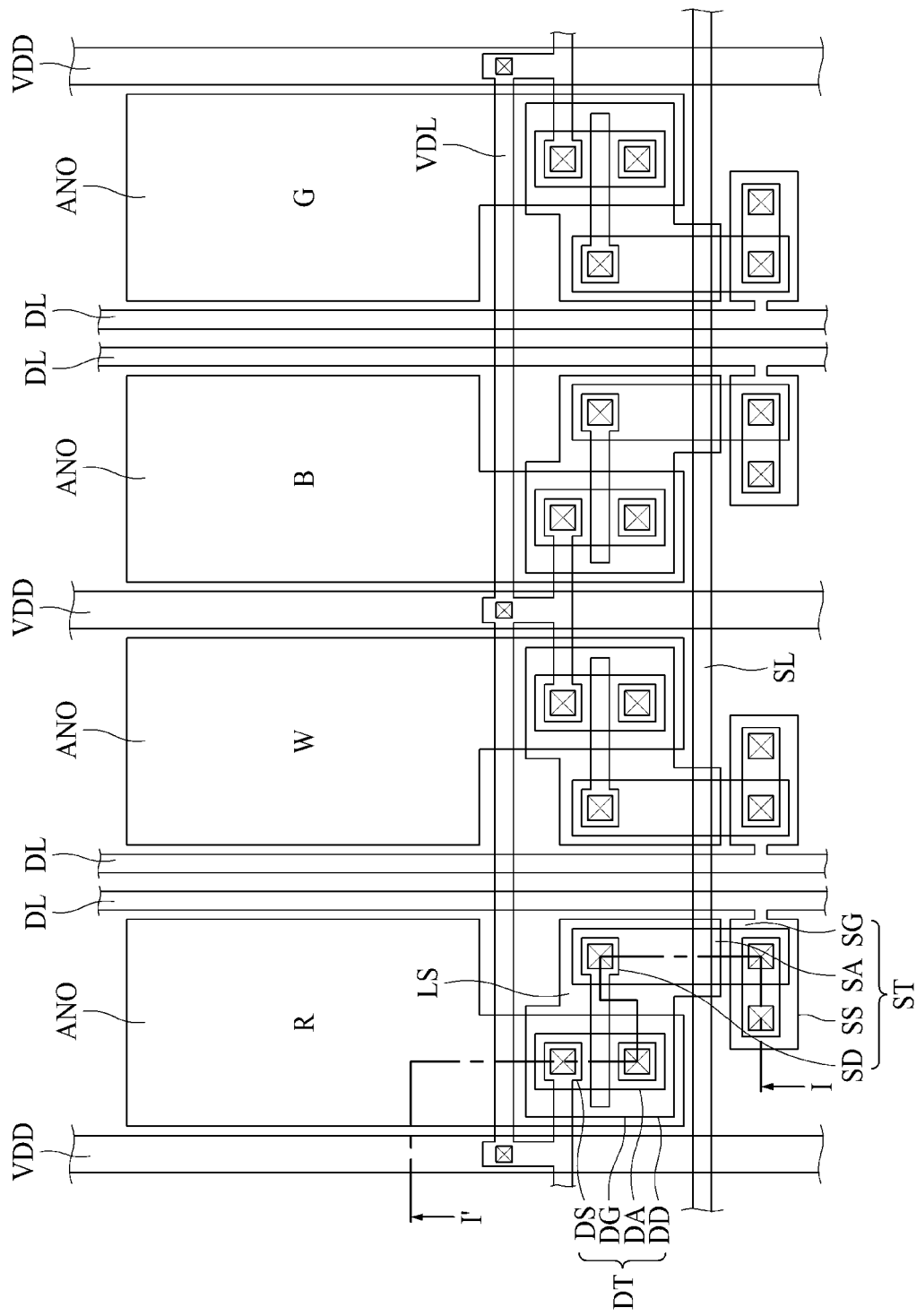
FIG. 3 is a plan view illustrating a structure of the pixels disposed in the electroluminescence display according to the present disclosure.
Figure 4:
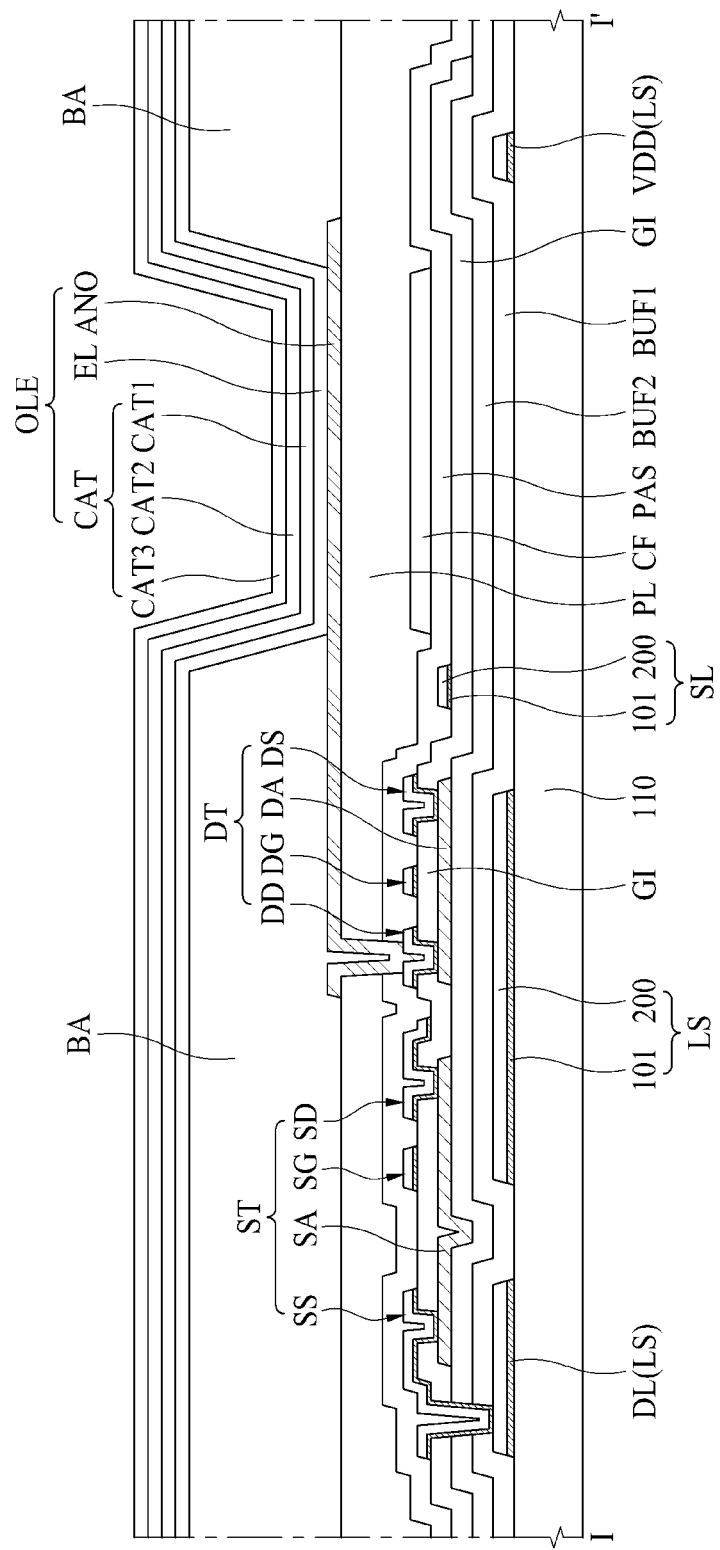
FIG. 4 is a cross-sectional view along the cutting line I-I' in FIG. 3, for illustrating the low reflecting structure of the electroluminescence display according to one embodiment of the present disclosure.

Hereinafter, referring to FIGS. 2 to 4, one embodiment of the present disclosure will be explained. FIG. 2 is a circuit diagram illustrating a structure of one pixel according to one embodiment of the present disclosure. FIG. 3 is a plan view illustrating a structure of the pixels according to one embodiment of the present disclosure. FIG. 4 is a cross-sectional view along to cutting line I-I' in FIG. 3, for illustrating the low reflecting structure of the electroluminescent display according to one embodiment of the present disclosure.

Referring to FIGS. 2 to 4, one pixel of the light emitting display may be defined by a gate line (or scan line) SL, a data line DL and a driving current line VDD. One pixel of the light emitting display may include a switching thin film transistor ST, a driving thin film transistor DT, a light emitting diode OLE and a storage capacitance Cst. The driving current line VDD may be supplied with a high-level voltage for driving the light emitting diode OLE.

A switching thin film transistor ST and a driving thin film transistor DT may be formed on a substrate SUB. For example, the switching thin film transistor ST may be disposed at the portion where the gate line SL and the data line DL is crossing. The switching thin film transistor ST may include a switching gate electrode SG, a switching source electrode SS and a switching drain electrode SD. The switching gate electrode SG may be connected to the gate line SL. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light diode OLE of the selected pixel by the switching thin film transistor ST. The driving thin film transistor DT may include a driving gate electrode DG, a driving source electrode DS and a driving drain electrode DD. The driving gate electrode DG may be connected to the switching drain electrode SD of the switching thin film transistor ST. For example, the driving gate electrode DG may be connected to the switching drain electrode SD via the drain contact hole DH penetrating the gate insulating layer GI. The driving source electrode DS may be connected to the driving current line VDD, and the driving drain electrode DD may be connected to an anode electrode ANO (or first electrode) of the light emitting diode OLE. A storage capacitance Cst may be disposed between the driving gate electrode DG of the driving thin film transistor DT and the anode electrode ANO of the light emitting diode OLE.

The driving thin film transistor DT may be disposed between the driving current line VDD and the light emitting diode OLE. The driving thin film transistor DT may control the amount of electric currents flowing to the light emitting diode OLE from the driving current line VDD according to the voltage level of the driving gate electrode DG connected to the switching drain electrode SD of the switching thin film transistor ST.

The light emitting diode OLE may include an anode electrode ANO, a light emitting layer EL and a cathode electrode CAT (or second electrode). The light emitting diode OLE may emit the light according to the amount of the electric current controlled by the driving thin film transistor DT. In other word, the light emitting diode OLE may be driven by the voltage differences between the low-level voltage and the high-level voltage controlled by the driving thin film transistor DT. The anode electrode ANO of the light emitting diode OLE may be connected to the driving drain electrode DD of the driving thin film transistor DT, and the cathode electrode CAT may be connected to a low-level voltage line VSS where a low-level potential voltage is supplied. That is, the light emitting diode OLE may be driven by the high-level voltage controlled by the driving thin film transistor DT and the low-level voltage supplied from the low-level voltage line VSS.

Referring to FIG. 4, the cross-sectional structure of an electroluminescence display according to one embodiment of the present disclosure will be explained. The light shielding layer LS may be disposed on the substrate 110, preferably directly on the substrate 110. The light shielding layer LS may be used for the data line DL and the driving current line VDD. Further, the light shielding layer LS may be disposed as being spaced apart from the data line DL and the driving current line VDD with a predetermined distance. The light shielding layer LS may have an island shape at least partly overlapping with the switching semiconductor layer SA of the switching thin film transistor ST and the driving semiconductor layer DA of the driving thin film transistor DT. The light shielding layer LS not used for any conductive line may block the external light from intruding into the semiconductor layer SA and DA to reduce deterioration of the characteristics of the semiconductor layers SA and DA. In one embodiment, the light shielding layer LS may be disposed as being overlapped with the channel regions in the semiconductor layers SA and DA which are overlapped with the gate electrodes SG and DG, respectively. In addition, the light shielding layer LS may be disposed as being overlapped with some portions of the source-drain electrodes SS, SD, DS and DD respectively contacting to the semiconductor layers SA and DA.

On the light shielding layer LS, a buffer layer BUF is disposed as covering the whole surface of the substrate 110.

In one embodiment of the present disclosure, the buffer layer BUF may have a first buffer layer BUF1 and a second buffer layer BUF2 that are sequentially stacked on each other. For example, the first buffer layer BUF1 may be formed of the silicon nitride (SiNx). The silicon nitride may have a property of having an index ratio of 1.8. The second buffer layer BUFs may be formed of the silicon oxide (SiOx). The silicon oxide may have a property of having an index ratio of 1.5. By forming the buffer layer with two layers having different optical properties as described above, light is reflected at the interface between the substrate 110 and the first buffer layer BUF1, and light is also reflected from the interface between the first buffer layer BUF1 and the second buffer layer BUF2. Here, by adjusting the thickness of the first buffer layer BUF1, the phases of the light reflected from the lower surface and the upper surface are opposite to each other so that the reflection ratio of light incident from the outside may be reduced. The more detailed description thereof may be given later.

On the buffer layer BUF, the switching semiconductor layer SA and the driving semiconductor layer DA are formed. In one embodiment, the channel areas in the semiconductor layers SA and DA are disposed as overlapping with the light shielding layer LS.

A gate insulating layer GI may be disposed on the surface of the substrate 110 having the semiconductor layers SA and DA. In one embodiment, the gate insulating layer GI may be formed of the same material with the second buffer layer BUF2. For example, the gate insulating layer GI may be formed of oxide silicon material. In this case, since the gate insulating layer GI and the second buffer layer BUF2 are made of the same material, light may be passing through the interface of them without being reflected. Therefore, it is not needed to consider the reflection of external light by the gate insulating layer GI.

On the gate insulating layer GI, a switching gate electrode SG may be formed as being overlapped with the switching semiconductor layer SA and a driving gate electrode DG may be formed as being overlapped with the driving semiconductor layer DA. At the both sides of the switching gate electrode SG, a switching source electrode SS contacting with one side of the switching semiconductor layer SA and being apart from the switching gate electrode SG may be formed, and a switching drain electrode SD contacting with the other side of the switching semiconductor layer SA and being apart from the switching gate electrode SG may be formed. In addition, at the both sides of the driving gate electrode DG, a driving source electrode DS contacting with one side of the driving semiconductor layer DA and being apart from the driving gate electrode DG may be formed, and a driving drain electrode DD contacting with the other side of the driving semiconductor layer DA and being apart from the driving gate electrode DG may be formed.

The gate electrodes SG and DG and the source-drain electrodes SS, SD, DS and DD are formed at the same layer, but they are separated each other. The switching source electrode SS may be connected to the data line DL formed as a part of the light shielding layer LS via a contact hole penetrating the gate insulating layer GI and the buffer layer BUF. In addition, the driving source electrode DS may be connected to the driving current line VDD formed as another part of the light shielding layer LS via another contact hole penetrating the gate insulating layer GI and the buffer layer BUF.

On the substrate 110 having the thin film transistors ST and DT, a passivation layer PAS may be deposited. The passivation layer PAS may be formed of a silicon oxide material. The passivation layer PAS may have a relatively very large area in surface contact with the gate insulating layer GI below it. By forming the passivation layer PAS of the same material as the gate insulating layer GI, the external light incident from the outside may not be reflected between the gate insulating layer GI and the passivation layer PAS.

A color filter CF may be formed on the passivation layer PAS. The color filter CF may be an element for representing color allocated at each pixel. In an example, one color filter CF may have a size and a shape corresponding to the size and the shape of one pixel. In another example, one color filter CF may have a size slightly larger than that of the light emitting diode OLE which will be formed later and may be disposed to overlap the light emitting diode OLE. Since the color filter CF transmits light of a specific wavelength and absorbs lights of other wavelengths, the amount of the lights after passing through the color filter CF may be much less than that of the light before passing through the color filter CF, so that the reflection of the external light between the color filter CF and the passivation layer PAS may not need to be considered.

A planarization layer PL may be deposited on the color filter CF. The planarization layer PL may be a thin film for flattening or evening the non-uniform surface of the substrate 110 on which the thin film transistors ST and DT are formed. To do so, the planarization layer PL may be made of the organic materials. The planarization layer PL may be in surface contact with the passivation layer PAS and be a material different from that of the passivation layer PAS, but the planarization layer PL may be made of a material having a refractive index similar to that of the silicon oxide in one embodiment.

The passivation layer PAS and the planarization layer PL may have a pixel contact hole for exposing some portions of the drain electrode DD of the driving thin film transistor DT. On the surface of the planarization layer PL, an anode electrode ANO may be formed. The anode electrode ANO may be connected to the drain electrode DD of the driving thin film transistor DT via the pixel contact hole. The anode electrode ANO may have different elements according to the emission condition of the light emitting diode OLE. For the bottom emission type in which the emitted light may be provided to the substrate 110, the anode electrode ANO may be made of a transparent conductive material in one embodiment. For the top emission type in which the emitted light may be provided to the direction opposite the substrate 110, in one embodiment the anode electrode ANO may include a metal material with excellent reflection ratio.

In the case of a large area display device such as a TV set, the cathode electrode CAT disposed on the anode electrode ANO may be formed as one layer as covering a large area. The cathode electrode CAT maintains a uniform low voltage over a wide area. Therefore, in case of a large-area display device, the cathode electrode CAT may be formed of an opaque metal material in order to maintain a low sheet resistance. Therefore, in case of a large-area display device, the bottom emission type structure is used. For the bottom emission type, the anode electrode ANO may be made of a transparent conductive material. For example, the anode electrode ANO may include oxide conductive materials such as indium-zin-oxide (IZO) or indium-tin-oxide (ITO). These oxide conductive materials may have a refractive index similar to that of silicon oxide. Therefore, reflection of external light by the anode electrode ANO may not need to be considered.

On the anode electrode ANO, a bank BA may be formed. The bank BA may define an emission area OA by covering the circumference area of the anode electrode ANO and exposing most middle areas of the anode electrode ANO. The bank BA may be disposed between neighboring two anode electrodes ANO. The display area AA may have a plurality of pixels P. Any one of pixel P may include the emission area not covered by the bank BA, and the non-emission area covered by the bank BA. The bank BA may be made of an organic material. By selecting a material having a refractive index of about 1.5, the reflection of the external light by the bank BA may not need to be considered. Alternatively, in case of selecting the bank BA material having a refractive index larger than 1.5, by using a black material to absorb light incident from the outside, the reflection of the external light may be suppressed.

An emission layer EL may be deposited on the anode electrode ANO and the bank BA. The emission layer EL may be deposited over the whole surface of the display area AA on the substrate 110, as covering the anode electrodes ANO and banks BA. For an example, the emission layer EL may include two or more stacked emission portions for emitting white light. In detail, the emission layer EL may include a first emission layer providing first color light and a second emission layer providing second color light, for emitting the white light by combining the first color light and the second color light.

In another example, the emission layer EL may include at least any one of blue-light emission layer, green-light emission layer and red-light emission layer corresponding to the color allocated to the pixel. In addition, the light emitting diode OLE may further include at least one functional layer for enhancing the light emitting efficiency and/or the service lifetime of the emission layer EL.

When the light emitting layer EL has an organic material, by selecting a material having a refractive index of about 1.5, the reflection of the external light by the interface between the emission layer EL and the anode electrode ANO may not need to be considered.

The cathode electrode CAT may be disposed on the emission layer EL. The cathode electrode CAT may be stacked on the emission layer EL as being surface contact each other. The cathode electrode CAT may be formed as one sheet element over the whole area of the substrate 110 as being commonly connected whole emission layers EL disposed at all pixels. In case of the bottom emission type, the cathode electrode CAT may include metal material having excellent light reflection ratio. For example, the cathode electrode CAT may include at least any one of aluminum (Al), silver (Ag), molybdenum (Mo), gold (Au), magnesium (Mg), calcium (Ca), molybdenum (Mo), titanium (Ti) or barium (Ba). The cathode electrode CAT may include a plurality of cathode layers, preferably a first cathode layer CAT1, a second cathode layer CAT2, and a third cathode layer CAT3 which are sequentially stacked.

The present disclosure provides a low-reflection structure for reducing the external light from being reflected by the metal materials of the display device. For an example, the present disclosure provides a structure for preventing or at least reducing the external light from being reflected by the cathode electrode CAT formed over the whole surface area of the substrate 110. Further, the present disclosure provides a structure for preventing or at least reducing the external light from being reflected by the light shielding layer LS disposed at the closest layer to the substrate 100. In addition, present disclosure provides a structure for preventing or at least reducing the external light from being reflected by some portions of the gate line SL exposed to the bottom surface of the substrate 110 because the exposed portions of the gate line SL are not overlapped with the light shielding layer LS.

Figure 5:
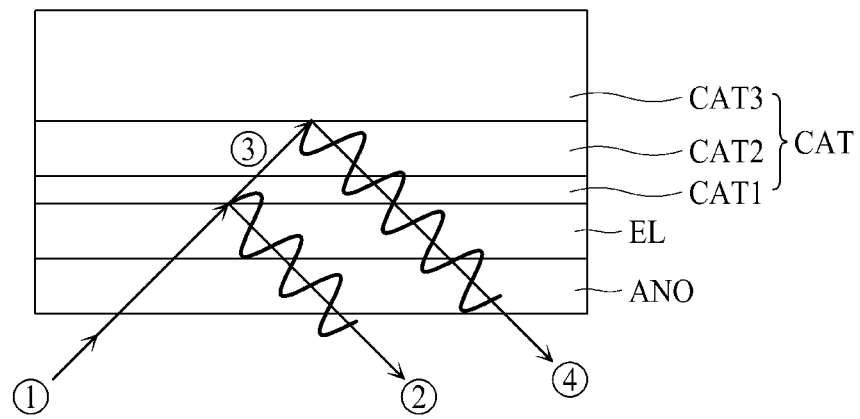
FIG. 5 is an enlarged cross-sectional view explaining a cathode electrode having a low-reflection structure in an electroluminescence display according to one embodiment of the present disclosure.

Referring to FIG. 5, in an embodiment of the present disclosure, the structure of the cathode electrode CAT for suppressing the reflection of the external light will be explained. FIG. 5 is an enlarged cross-sectional view explaining a cathode electrode having a low-reflection structure in an electroluminescence display according to one embodiment of the present disclosure.

In a bottom emission type electroluminescence display according to the present disclosure, the cathode electrode CAT may include three cathode layers. For example, the cathode electrode CAT may include a first cathode layer CAT1, a second cathode layer CAT2 and a third cathode layer CAT5 sequentially stacked on the emission layer EL. The first cathode layer CAT1 may be firstly stacked on the emission layer EL so as to be in direct surface contact with the emission layer EL. The first cathode layer CAT1 may made of a metal material having relatively low surface resistance. For example, the first cathode layer CAT1 may include any one of aluminum (Al), silver (Ag), molybdenum (Mo), gold (Au), magnesium (Mg), calcium (Ca), titanium (Ti) and barium (Ba). Considering the manufacturing process and cost, a case in which the first cathode layer CAT1 may be formed of aluminum will be explained as one example.

In the case that the first cathode layer CAT1 is made of aluminum, the first cathode layer CAT1 may be formed a thickness of 100 Å to 200 Å. The metallic materials such as aluminum are opaque and relatively highly reflective.

The second cathode layer CAT2 may include conductive resin materials. The conductive resin materials may include a domain material made of a resin material with high electron mobility and a dopant for lowering the barrier energy of the domain material. For example, the domain material is a base material to maintain the electron mobility in certain level over the entire second cathode layer CAT2 as one domain. The resin materials having high electron mobility may include any one selected from Alq3, TmPyPB, Bphen, TAZ and TPB. Alq3 may be an abbreviation of 'Tris(8-hydroxyquinoline) Aluminum', and be a complex having a chemical formula of Al(C9H6NO)3. TmPyPB may be an organic material that is an abbreviation of '1,3,5-tri (m-pyrid-3-yl-phenyl) benzene'. Bphen may be an organic material that is an abbreviation of 'Bathophenanthroline'. TAZ may be organic material that is an abbreviation of '1,2,3-triazole'. TPB may be organic material that is an abbreviation for triphenyl bismuth. Since these organic materials have high electron mobility, they may be used in a light emitting element.

The material of the dopant may include an alkali-based doping material. For example, the material of the dopant may include at least any one of lithium (Li), cesium (Cs), cesium oxide (Cs2O3), cesium nitride (CsN3), rubidium (Rb) and rubidium oxide (Rb2O). In another example, the material of the dopant may include fullerene having high electron mobility. Fullerene may be a generic term for molecules in which carbon atoms are arranged in a sphere, ellipsoid or cylinder shape. For example, the material of the dopant may include Buckminster-fullerene (C60) in which 60 carbon atoms are mainly bonded in the shape of a soccer ball. In addition, the material of the dopant may include higher fullerenes such as C70, C76, C78, C82, C90, C94 and C96.

The second cathode layer CAT2 may have the same materials as the electron transporting layer or electron injecting layer included into the emission layer EL. However, unlike the electron transporting layer or the electron injecting layer, the second cathode layer CAT2 may have higher electron mobility than the electron transporting layer or the electron injecting layer. For example, the electron transporting layer or the electron injecting layer may have the electron mobility of $5.0 \times 10^{-4}$ (S/m) to $9.0 \times 10^{-1}$ (S/m), whereas the second cathode layer CAT2 may have an electron mobility of $1.0 \times 10^{-3}$ (S/m) to $9.0 \times 10^{+1}$ (S/m). For this, the conductive resin materials included into the second cathode layer CAT2 may have a dopant content higher than that of the electron transporting layer or the electron injecting layer.

For example, the electron transporting layer or the electron injecting layer has a dopant doping concentration of 2% to 10%, whereas the second cathode layer CAT2 may be a conductive resin material having a dopant doping concentration of 10% to 30% according to one embodiment. The domain material itself, in which the dopant has a doping concentration of 0%, may have an electrical conductivity of $1.0 \times 10^{-4}$ (S/m) to $5.0 \times 10^{-3}$ (S/m). By doping 10% to 30% of dopant into the domain material, the second cathode layer CAT2 may have improved electrical conductivity to $1.0 \times 10^{-3}$ (S/m) to $9.0 \times 10^{+1}$ (S/m) to be used as a cathode electrode.

In one case, the second cathode layer CAT2 may have the same conductivity as the electron functional layer (electron transporting layer and/or electron injecting layer) of the emission layer EL. In this case, the sheet resistance of the cathode electrode CAT may be maintained at a sufficiently low value due to the first cathode layer CAT1 made of aluminum.

The third cathode layer CAT3 may be made of the same material as the first cathode layer CAT1. In one embodiment, the third cathode layer CAT3 may have a sufficient thickness so that the sheet resistance of the cathode electrode CAT may be maintained at a constant value regardless of the position of the substrate SUB while not transpassing the light but reflecting all of the light. For example, the third cathode layer CAT3 may be formed of a metal material having a low sheet resistance to have a relatively thicker thickness than the first and second cathode layers CAT1 and CAT2 in order to lower the overall sheet resistance of the cathode electrode CAT. For example, the third cathode layer CAT3 may be formed of aluminum having a thickness in range of 2,000 Å to 4,000 Å.

The cathode electrode CAT having such a thickness and a stacked structure mentioned above may reduce reflection ratio with respect to the light incident from the bottom direction of the substrate (i.e., from the outside to the first cathode layer CAT1). A portion requiring external light reflection suppression may be a display area that may mainly affect image information. Accordingly, it is preferable to implement a low reflection structure to the cathode electrode CAT that is commonly applied over the entire display area DA. Hereinafter, description will be made with reference to arrows indicating the optical path shown in FIG. 5.

Referring to the structure of the cathode electrode CAT included into light emitting diode OLE, the incident light ① from the lower outside of the cathode electrode CAT may pass through the anode electrode ANO and the emission layer EL which are transparent. Some of the incident light ① may be reflected at the bottom (or lower) surface of the first cathode layer CAT1 and then proceed toward the substrate 110 as the first reflected light ②. Since the first cathode layer CAT1 has a thin thickness of 200 Å or less, all of the incident light ① may not be reflected. For example, 45% of the incident light ① may be reflected as the first reflected light ②, and the remaining 55% of the incident light ① may pass through the first cathode layer CAT1. The whole amount of the transmitted light ③ passing through the first cathode layer CAT1 may pass through the transparent second cathode layer CAT2. After that, the transmitted light ③ may be reflected by the third cathode layer CAT3. Since the third cathode layer CAT3 may have a thickness of 2,000 Å to 4,000 Å, the whole amount of the transmitted light ③ may be reflected and proceed toward the substrate 110 as the second reflected light ④.

Here, by adjusting or changing the thickness of the second cathode layer CAT2, the phases of the first reflected light ② and the second reflected light ④ may be set to cancel each other. For example, the first reflected light ② may correspond to 45% of the incident light ①, while the second reflected light ④ may be almost equal to the amount of transmitted light ③ as corresponding to 55% of the incident light ①. Accordingly, the amount of reflected light remaining due to phase destructive interference may be about 5%. However, considering the amount of light absorbed by the various thin film layers, the reflected light luminance, which is the intensity of the reflected light incident from outside of the cathode electrode CAT and finally reflected to the outside of the substrate 110 may be reduced to 2% or less.

Meanwhile, among the light emitted from the emission layer EL, the amount of light emitted to the direction of the cathode electrode CAT and reflected by the cathode electrode CAT may be reduced to about 2% through the same mechanism. However, since the light emitted from the emission layer EL may be propagated in all directions, the amount of light reduced by the cathode electrode CAT may be only about 50% of the total amount of the light from the emission layer EL, and the remaining 50% may be emitted toward the substrate 110.

The electroluminescence display according to the present disclosure may be the bottom emission type including cathode electrode CAT of a triple layer stacked structure. The reflection of the external light may be suppressed as much as possible by the structure of the cathode electrode CAT of the triple layer stacked structure. Therefore, there is no need to dispose a polarization element on the outside of the substrate 110 to reduce the external light reflection. The polarization element has a positive effect of suppressing the external light reflection, but has a negative effect of reducing the amount of light emitted from the emission layer EL by at least 50%.

In the electroluminescence display according to the present disclosure, the amount of the light emitted from the emission layer EL may be reduced by about 50% due to the cathode electrode CAT of the triple layer stack structure, but this is almost the same as the reduction in the amount of light due to the polarization element. Accordingly, the electroluminescence display according to the present disclosure may reduce the external light reflection while providing the same level of luminous efficiency without using an expensive polarization element.

Figure 6:
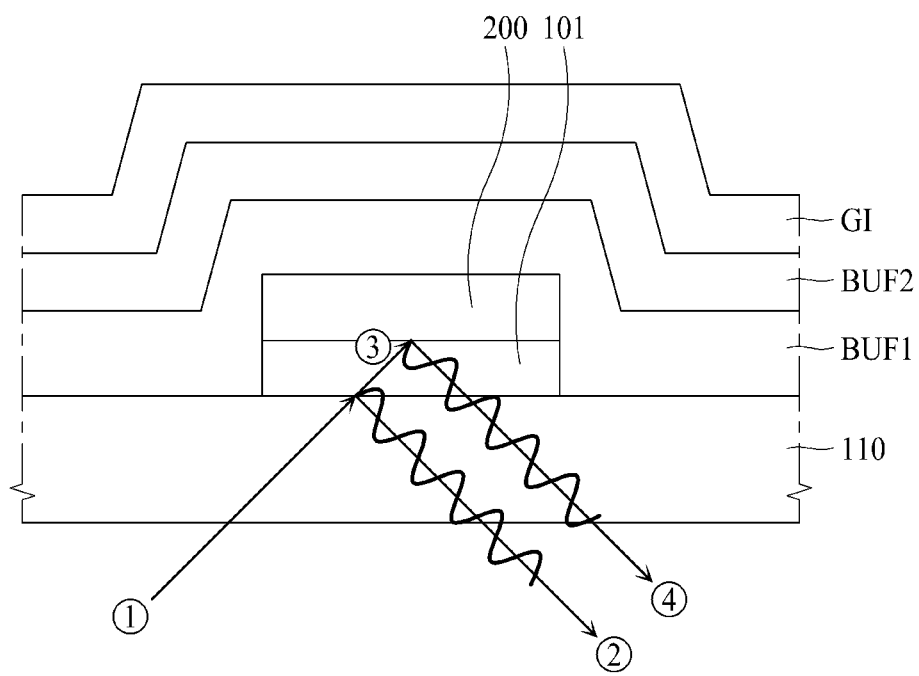
FIG. 6 is an enlarged cross-sectional view illustrating a light shielding layer having a low-reflection structure in an electroluminescence display according to one embodiment of the present disclosure.
Figure 7:
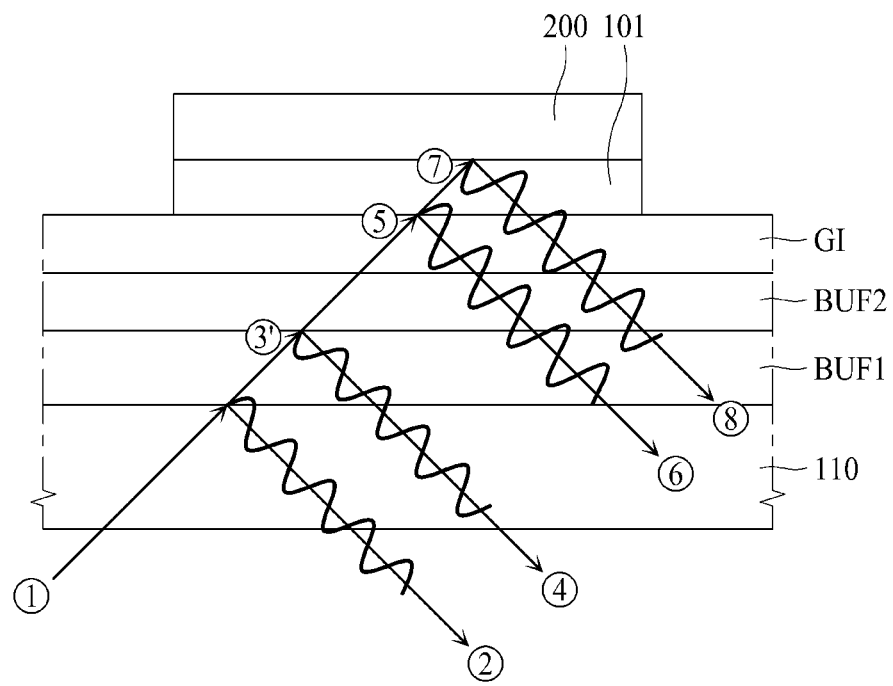
FIG. 7 is an enlarged cross-sectional view illustrating a line having a low-reflection structure in an electroluminescence display according to one embodiment of the present disclosure.

Hereinafter, referring to FIGS. 6 and 7, a structure for suppressing the reflection of the external light in the light shielding layer LS and the gate line SL will be explained. FIG. 6 is an enlarged cross-sectional view illustrating a light shielding layer having a low-reflection structure in an electroluminescence display according to one embodiment of the present disclosure. FIG. 7 is an enlarged cross-sectional view illustrating a line having a low-reflection structure in an electroluminescence display according to one embodiment of the present disclosure.

In the present disclosure, the light shielding layer LS and the gate line SL, wherein the gate line SL is representing the gate line SL, the gate electrodes SG and DG, the source-drain electrodes SS, SD, DS and DD and the link line VDL connecting the driving drain electrode DD to the driving current line VDD, may have the structure for suppressing the external light reflection. For example, the gate line SL may have a structure in which a first metal oxide layer 101 (e.g., a first reflective layer) and a second metal layer 200 (e.g., a second reflective layer) may be stacked sequentially.

The first metal oxide layer 101 may include low reflective metal oxide materials. The low reflective metal oxide material may be formed of molybdenum-titanium-oxide (MTO). The second metal layer 200 may include low resistance metallic materials. For example, the low resistance metallic materials may include copper (Cu), aluminum (Al), silver (Ag), gold (Au) or the likes. Thus, the first metal oxide layer 101 while still reflective is less reflective than the second metal layer 200.

Here, the first metal oxide layer 101 may be an oxide layer for matching the refractive index. Since the refractive index of the first metal oxide layer 101, which is an oxide, may be significantly different from that of the second metal layer 200, which is a metallic material, the reflection of the external light may be suppressed by using the phase destructive interference between the light reflected from the first metal oxide layer 101 and the light reflected from the second metal layer 200.

Referring to FIG. 6, the mechanism for suppressing the reflection of the external light by the light shielding layer LS will be firstly described. Some of the incident light ① passing through the substrate 110 from the bottom side of the light shielding layer LS may be reflected by the bottom (or lower) surface of the first metal oxide layer 101 and then proceed toward the substrate 110 as the first reflected light ②. The first metal oxide layer 101 is an oxide material and has relatively high transparency, and may not reflect all of the incident light ① due to a difference in refractive index at the interface with the substrate 110. For example, about 45% of the incident light ① may be reflected as the first reflected light ②, other 55% off the incident light ① may pass through the first metal oxide layer 101. The transmitted light ③ passing through the first metal oxide layer 101 may be reflected by the opaque second metal layer 200. Since the second metal layer 200 is formed of an opaque metal material, all of the transmitted light ③ may be reflected and proceed toward the substrate 110 as the second reflected light ④.

Here, by adjusting or controlling the thickness of the first metal oxide layer 101, the phases of the first reflected light ② and the second reflected light ④ may be set to cancel each other. When it is desired to selectively lower the reflection ratio of green light to which the human eye is most sensitive, the thickness of the first metal oxide layer 101 may be set to corresponding to a multiple of a half wavelength of the green light. For example, when the representative wavelength of green light is 550 nm, the first metal oxide layer 101 may be formed to have a thickness of 275 Å, which is a multiple of 275 nm, which is a half wavelength of green light, or any thicknesses of the integer multiple thereof. As a result, reflected light luminance, which is the intensity of the reflected light that is incident to and reflected from the bottom outside of the light shielding layer LS, may be reduced to a level of 5% or less.

Referring to FIG. 7, the mechanism for suppressing the reflection of the external light by the gate line SL will be described. Some of the incident light ① passing through the substrate 110 from the bottom side of the gate line SL may be reflected by an interface between the substrate 110 and the first buffer layer BUF1 and then proceed toward the substrate 110 as the first reflected light ②. In the case that the substrate 110 may be a glass substrate having the refractive index of 1.5, and the first buffer layer BUF1 may be a silicon nitride having the refractive index of 1.8, due to the difference of the refractive index, some reflection may occur at the interface between the substrate 110 and the first buffer layer BUF1. The remaining light not reflected may pass through the first buffer layer BUF1. The first transmitted light ③' passing through the first buffer layer BUF1 may be partially reflected at the interface between the first buffer layer BUF1 and the second buffer layer BUF2, and then may proceed toward the substrate 110 as the second reflected light ④. The remaining light not reflected may pass through the second buffer layer BUF2 and may proceed as the second transmitted light ⑤.

Here, the rate of the reflection from the interface between the substrate 110 and the first buffer layer BUF1 and the rate of reflection from the interface between the first buffer layer BUF1 and the second buffer layer BUF2 may be adjusted by the thickness of the first buffer layer BUF1 and the thickness of the second buffer layer BUF2. For example, by setting the thickness of the first buffer layer BUF1 to 1,700 Å and the thickness of the second buffer layer BUF2 to 2,400 Å, or by setting the thickness of the first buffer layer BUF1 to 1,300 Å and the thickness of the second buffer layer BUF2 to 2,000 Å, the rate of reflection from the interface between the substrate 110 and the first buffer layer BUF1 may be adjusted to 20%, and the rate of the reflection from the interface between the first buffer layer BUF1 and the second buffer layer BUF2 may be adjusted to 25%.

As the result, 20% of the incident light ① may be reflected as the first reflected light ②, and 80% of the incident light ① may be the first transmitted light ③' passing through the first buffer layer BUF1. Since 25% of the first transmitted light ③' may be reflected as the second reflected light ④, the second reflected light ④ may be corresponding to the 20% of the incident light ①. Here, by setting or selecting the thickness of the first buffer layer BUF1 as being the condition such that the phases of the first reflected light ② and the second reflected light ④ are opposite, the first reflected light ② and the second reflected light ④ may be removed by the destructive interference. That is, by adjusting and controlling the thickness of the first buffer layer BUF1 and the second buffer layer BUF2, 40% of the incident light ① entering onto the gate line SL may be firstly reduced.

Next, the second transmitted light ⑤ passing through the second buffer layer BUF2 may be phase cancelled due to the low reflection structure of the gate line SL. For example, the second transmitted light ⑤ may be partially reflected at the bottom surface of the first metal oxide layer 101, and may proceed to the substrate 110 as the third reflected light ⑥. The first metal oxide layer 101 is an oxide and has high transparency, and does not reflect all of the second transmitted light ⑤ due to a difference in refractive index at the interface with the gate insulating layer GI. For example, about 45% of the second transmitted light ⑤ may be reflected as the third reflected light ⑥, and the remaining 55% may pass through the first metal oxide layer 101. The third transmitted light ⑦ passing through the first metal oxide layer 101 may be reflected by the opaque second metal layer 200. Since the second metal layer 200 is formed of an opaque metal material, all of the third transmitted light ⑦ may be reflected and proceed toward the substrate 110 as the fourth reflected light ⑧.

For an example, 25% of the first transmitted light ③' may be reflected as the second reflected light ④, and the remaining 75% of the first transmitted light ③' may proceed as the second transmitted light ⑤. As the result, the second transmitted light ⑤ may correspond to 60% of the incident light ①. Since the third reflected light ⑥ may be 45% of the second transmitted light ⑤, it may correspond to 27% of the incident light ①. Further, since the fourth reflected light ⑧ may reflect all of the third transmitted light ⑦, it may correspond to 33% of the incident light ①. Here, by adjusting the thickness of the first metal oxide layer 101, the phases of the third reflected light ⑥ and the fourth reflected light ⑧ may be set to cancel each other. As the result, about 6% of the third reflected light ⑥ and the fourth reflected light ⑧ may be reflected light due to the destructive interference. As described above, considering the amount of light partially absorbed by the thin films through which external light passes during the process of destructive interference, the reflected light luminance, which is the intensity of the reflected light incident from the bottom outside of the gate line SL may be 5% or less.

The electroluminescence display according to the present disclosure may suppress the reflection of the external light at the cathode electrode CAT by applying the low-reflection structure to the cathode electrode CAT including metal material and deposited over the whole area of the substrate. In addition, by applying the low reflection structure using metal oxide layer to the light shielding layer LS, the reflection of the external light may be suppressed. There are relatively thick layers are stacked under the cathode electrode CAT. Since the relatively thick layers may not cause the reflection of the external light at the interfaces of them, just by applying the low reflection structure to the cathode electrode CAT, the reflection of the external light may be effectively reduced or suppressed. For the light shielding layer LS, since there are no other layers between the light shielding layer LS and the substrate 110, it is sufficient to suppress the reflection of the external light just by applying the low reflection structure to the light shielding layer LS. However, for the gate line SL, there are other layers such as the buffer layer BUF, so that the reflection ratio may be increased at the interface of other layers. In order to reduce or suppress the reflection which may be caused and increased at the gate line SL and the like, the present disclosure provides an external light reflection suppression structure by adjusting and/or controlling the thickness of the layer and optical property such as refractive index.

Figure 8:
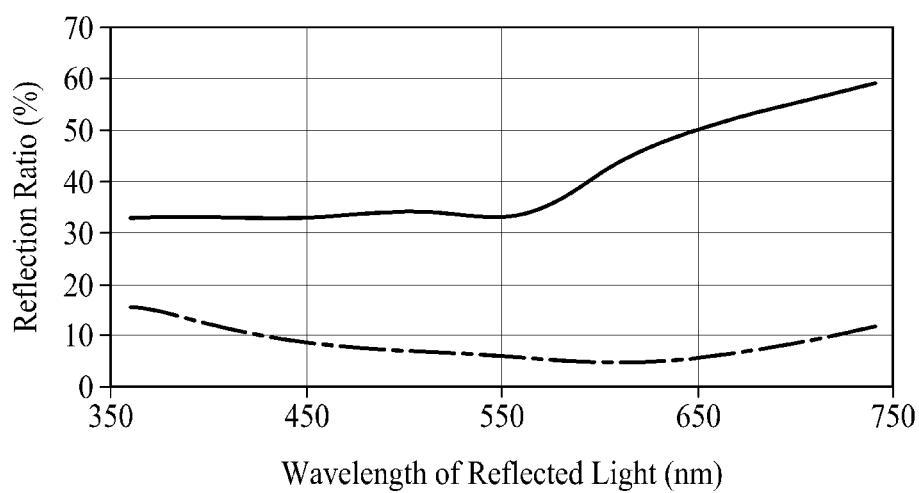
FIG. 8 is a graph diagram illustrating the degree of reflection suppression by the light shielding layer having a low-reflection structure in an electroluminescence display according to the preferred embodiment of the present disclosure.

Hereinafter, referring to various experimental graphs, results of suppressing external light reflection according to the structural characteristics of the buffer layer BUF will be described. Referring to FIG. 8, the external light reflection ratio tested by applying the low-reflection structure to the light shielding layer LS will be explained. FIG. 8 is a graph diagram illustrating the degree of reflection suppression by the light shielding layer having a low-reflection structure in an electroluminescence display according to the one embodiment of the present disclosure. From FIG. 8, it may be seen that the reflection ratio of light between 550 nm and 650 nm, which is the most sensitive green wavelength band to the human eye, may be about 5% due to the low-reflection structure of the present disclosure.

Figure 9:
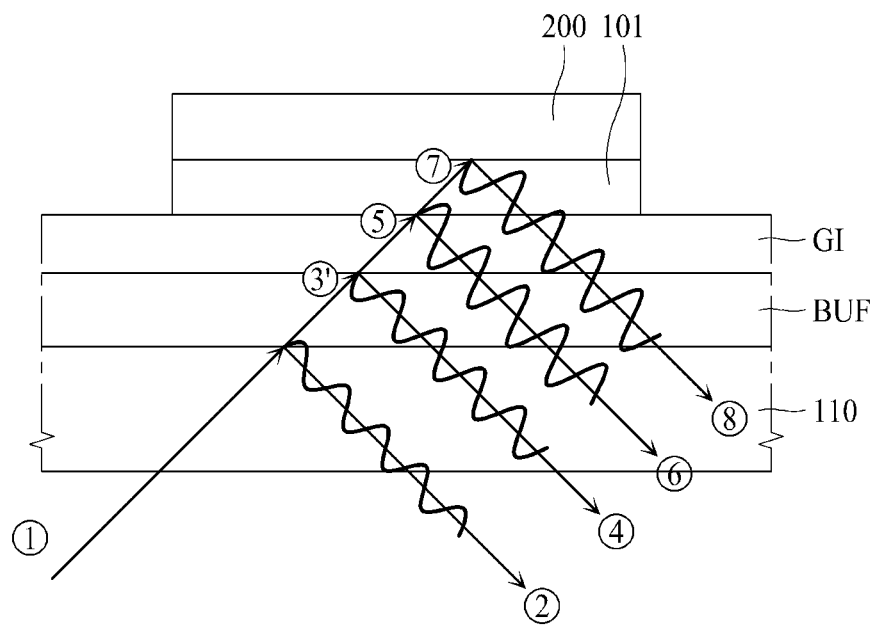
FIG. 9 is an enlarged cross-sectional view illustrating the light reflection mechanism for the case of the electroluminescence display having single buffer layer according to the comparative example different from the embodiment of the present disclosure.

Meanwhile, referring to FIG. 9, a comparative example in which the gate line SL has the same low-reflection structure as the light shielding layer but the buffer layer BUF is a single layer will be described. FIG. 9 is an enlarged cross-sectional view illustrating the light reflection mechanism for the case of the electroluminescence display having single buffer layer according to the comparative example different from the embodiment of the present disclosure.

Referring to FIG. 9, a buffer layer BUF may be disposed on the substrate SUB. The buffer layer BUF may have a single layered structure. The gate insulating layer GI may be deposited on the buffer layer BUF. The gate line GL may be formed on the gate insulating layer GI. The gate line SL may have the same structure as the light shielding layer LS. For example, the gate line SL may include the first metal oxide layer 101 and the second metal layer 200 stacked sequentially.

The first metal oxide layer 101 may include low reflective metal oxide materials. The low reflective metal oxide material may be formed of molybdenum-titanium-oxide (MTO). The second metal layer 200 may include low resistance metallic materials. For example, the low resistance metallic materials may include copper (Cu), aluminum (Al), silver (Ag), gold (Au) or the likes. As the result, like the mechanism explained with FIGS. 6 and 7, the external light reflection may be suppressed by canceling the phase of the reflected light by the first metal oxide layer 101 (i.e., the third reflected light ⑥) with the phase of the reflected light by the second metal layer 200 (i.e., the fourth reflected light ⑧).

For the case that the buffer layer BUF may include a silicon oxide (SiOx), since the substrate 110, the buffer layer BUF and the gate insulating layer GI have the same refractive index of 1.5, the reflected light may not occur at the interfaces of them disposed under the gate line SL. Even if the reflected light may occur, it may be not at a level to be considered. The buffer layer BUF may be an insulating layer for electrically insulating the light shielding layer LS from other metal layers stacked thereon. The buffer layer BUF may be in surface contact with the light shielding layer LS, and silicon oxide may have poor interface properties with a metal material, so a peeling phenomenon may occur between the buffer layer BUF and the light shielding layer LS, as time passes.

In order to solve this peeling off problem, the buffer layer BUF may be formed of silicon nitride (SiNx). When the buffer layer BUF is formed of silicon nitride (SiNx), the buffer layer BUF may have a refractive index of 1.8 in the structure in which the substrate 110, the buffer layer BUF and the gate insulating layer GI are stacked as shown in FIG. 9. Accordingly, the external light may be reflected at the interface between substrate 110 and the buffer layer BUF and/or at the interface between the buffer layer BUF and the gate insulating layer GI.

The gate insulating layer GI may be a layer stacked between the gate electrodes SG and DG and the semiconductor layers SA and DA, and may be designed to form an electric field suitable for the semiconductor layers SA and DA with a voltage applied to the gate electrodes SG and DG. Accordingly, the thickness of the gate insulating layer GI may be fixed according to the characteristics of a display device and the manufacturing process conditions.

When the single buffer layer BUF is made of silicon nitride, it may have a reflection mechanism as shown in FIG. 9. Compared with FIG. 7, although it has a very similar mechanism, it may be difficult to suppress the reflected light. For example, the incident light ① passing through the substrate 110 from the bottom side of the gate line SL may be partially reflected by interface between the substrate 110 and the buffer layer BUF and then proceed toward the substrate 110 as the first reflected light ②. The remaining light not reflected may pass through the buffer layer BUF. The first transmitted light ③' passing through the buffer layer BUF may be partially reflected at the interface between the buffer layer BUF and the gate insulating layer GI, and then may proceed toward the substrate 110 as the second reflected light ④. The remaining lights not reflected may pass through the gate insulating layer GI and may proceed as the second transmitted light ⑤.

The second transmitted light ⑤ passing through the gate insulating layer GI may be reduced due to the phase destructive interference between the third reflected light ⑥ and the fourth reflected light ⑧, as the mechanism explained with FIG. 7. However, there may be a relatively large difference between the first reflected light ② and the second reflected light ④, so the reflected light may not be suppressed. For example, even though the thickness of the buffer layer BUF is adjusted so that the phases of the first reflected light ② and the second reflected light ④ are opposite, the thickness of the gate insulating layer GI may not be adjusted, so it may be very hard to adjust the light amount of the first reflected light ② and that of the second reflected light ④ to a similar level. Accordingly, in the case of a comparative example including a single buffer layer BUF, in particular, a single buffer layer BUF made of silicon nitride, the external light reflection at the gate line SL may exceed 5% and the external light reflection of 10% or more may be occurred.

Figure 10:
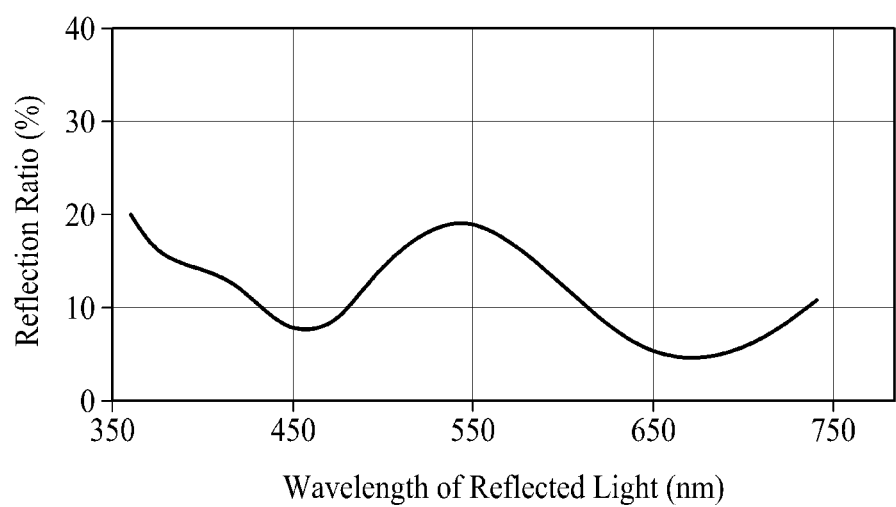
FIG. 10 is a graph diagram illustrating the reflection ratio by the gate line in a comparative example having the same low reflection structure as the light shielding layer according to the structure in FIG. 9.

Actually, when the external light reflection ratio is measured for the structure of the comparative example as shown in FIG. 9, a graph as shown in FIG. 10 may be obtained. FIG. 10 is a graph diagram illustrating the reflection ratio by the gate line in a comparative example having the same low reflection structure as the light shielding layer according to the structure in FIG. 9. It may be known that even when the low reflection structure is applied to the gate line SL, if the structure for suppressing external light reflection is not applied to the buffer layer BUF, the reflection ratio may be increased to about 10% to 20%.

Figure 11:
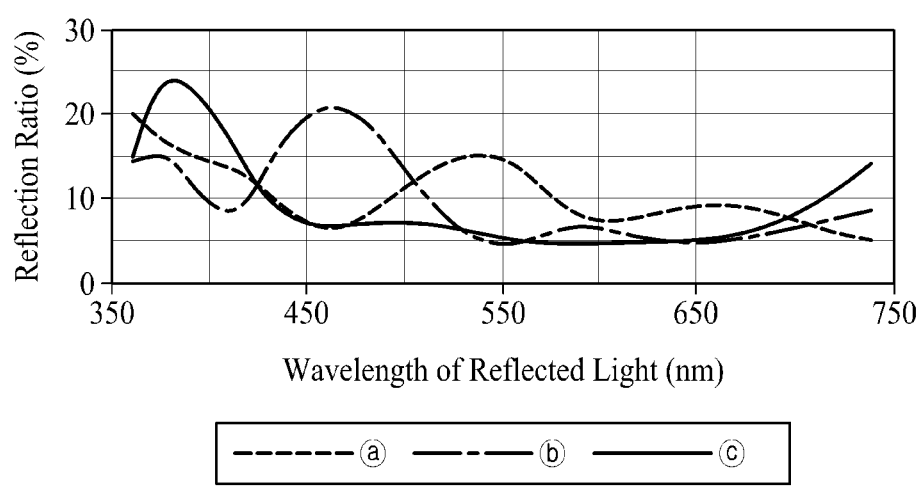
FIG. 11 is a graph diagram illustrating the reduction in reflection ratio implemented by the low reflection structure in the electroluminescence display according to an embodiment of the present disclosure.

On the other hand, when the structure of the buffer layer BUF according to the present disclosure is applied, the same result as shown in FIG. 11 may be obtained. FIG. 11 is a graph diagram illustrating the reduction in reflection ratio implemented by the lower reflection structure in the electroluminescence display according to one embodiment of the present disclosure. The curve ⓐ in the graph of FIG. 11 refers to the reflection ratio due to the external light according to the related art, that is, when the low-reflection structure is not applied at all. The curve ⓑ may indicates the reflection ratio due to the external light when the first buffer layer BUF1 has a thickness of 1,700 Å and the second buffer layer BUF2 has a thickness of 2,000 Å. Further, the curve ③ may indicates the reflection ratio due to the external light when the first buffer layer BUF1 has a thickness of 1,300 Å and the second buffer layer BUF2 has a thickness of 2,000 Å. Referring to FIG. 11, it may be known that, in the case of having the structure of the buffer layer according to the present disclosure, the external light reflection ratio is lowered to a level of 5% for the light of 550 nm to 650 nm, which is the green wavelength band most sensitive to the human eye.

In the graph of FIG. 11, curves for representative thickness values are shown. However, in the actual experiment, in the case of the first buffer layer BUF1, the thickness variation was made in 100 Å unit from 1,300 Å to 1,700 Å, and in the case of the second buffer layer BUF2, the thickness variations was made in 100 Å unit from 2,000 Å to 2,400 Å. As a result, the graph results in which the curves are distributed between the curve and the curve shown in FIG. 11 was measured. Accordingly, the thickness of the first buffer layer BUF1 and the second buffer layer BUF2 may not be limited to the thickness described in the graph of FIG. 11. The first buffer layer BUF1 may have a thickness selected from 1,300 Å to 1,700 Å, and the second buffer layer BUF2 may have any thickness selected from 2,000 Å to 2,400 Å.

Consequently, by sequentially stacking a first buffer layer BUF1 made of silicon nitride and a second buffer layer BUF2 made of silicon oxide are on the substrate 110 with adjusting the thicknesses thereof, the reflection of the external light may be lowered to the same level as the case of with the polarization element, without providing the polarization element. In particular, the cathode electrode having the low reflection structure is provided at the emission area OA, and the low reflection structure is also applied to the non-emission area NOA including the light shielding layer LS and the lines (including the gate line SL), so the external light reflection may be reduced or suppressed to a level of 5% or less. Further, it may be known that the structure of the buffer layer BUF according to the present disclosure may not affect negatively to the external light reflection suppression rate by the low reflective cathode electrode in the emission area OA. In some cases, a black resin material may be applied to the bank BA to further reduce the reflection ratio of the external light.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment may be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
   a light shielding layer on a substrate, the light shielding layer including a first metal layer and a second metal layer on the first metal layer;
   a first buffer layer at least partially covering the light shielding layer on the substrate;
   a second buffer layer on the first buffer layer;
   a gate insulating layer on the second buffer layer;
   a gate line on the gate insulating layer and non-overlapping with the light shielding layer, the gate line including a third metal layer and a fourth metal layer on the third metal layer;
   a passivation layer at least partially covering the gate line;
   a planarization layer on the passivation layer; and
   an emission element including a first electrode, an emission layer, and a second electrode sequentially arranged on the planarization layer,
   wherein the second electrode includes:
      a first cathode layer on the emission layer;
      a second cathode layer on the first cathode layer; and
      a third cathode layer on the second cathode layer.

2. The electroluminescence display of claim 1, further comprising:
   a bank covering circumference areas of the first electrode and exposing portions of the first electrode to define an emission area, the bank including black resin material.

3. The electroluminescence display of claim 1, wherein the second cathode layer has a thickness such that a first reflected light reflected from a bottom surface of the first cathode layer has a first phase and a second reflected light reflected from the third cathode layer has a second phase that is opposite the first phase.

4. The electroluminescence display of claim 3, wherein the first cathode layer comprises a first metal material and a first thickness in a range of 100 Å to 200 Å,
   wherein the second cathode layer comprises a conductive organic material including a domain material and a dopant, and
   wherein the third cathode layer comprises a second metal material and a second thickness in a range of 2,000 Å to 4,000 Å.

5. The electroluminescence display of claim 1, wherein the first metal layer comprises a thickness such that a first reflected light reflected from a bottom surface of the first metal layer has a first phase and a second reflected light reflected at an interface between the first metal layer and the second metal layer has a second phase that is opposite the first phase.

6. The electroluminescence display of claim 5, wherein the first metal layer and the third metal layer each comprise a metal oxide material and a thickness in a range of 100 Å to 500 Å, and
   wherein the second metal layer and the fourth metal layer each comprise a metal material and a thickness in a range of 2,000 Å to 4,000 Å.

7. The electroluminescence display of claim 1, wherein the first buffer layer comprises a first refractive index, and the second buffer layer comprises a second refractive index that is different from the first refractive index.

8. The electroluminescence display of claim 7, wherein the substrate, the gate insulating layer, and the passivation layer comprise the second refractive index.

9. The electroluminescence display of claim 7, wherein the first buffer layer comprises silicon nitride having a first refractive index of 1.8, and
   wherein the second buffer layer comprises a silicon oxide having a second refractive index of 1.5.

10. The electroluminescence display of claim 1, wherein the first buffer layer comprises a thickness such that a first reflected light reflected from a first interface between the substrate and the first buffer layer has a first phase and a second reflected light reflected from a second interface between the first buffer layer and the second buffer layer has a second phase that is opposite the first phase.

11. The electroluminescence display of claim 10, wherein the first buffer layer comprises a silicon nitride having a first thickness in a range of 1,300 Å to 1,700 Å, and
wherein the second buffer layer comprises a silicon oxide having a second thickness in a range of 2,000 Å to 2,400 Å.

12. The electroluminescence display of claim 1, further comprising:
a semiconductor layer disposed on the second buffer layer, the semiconductor layer overlapped with the light shielding layer and at least partially covered by the gate insulating layer;
a gate electrode, a source electrode, and a drain electrode on the gate insulating layer, the gate electrode comprising at least one of the third metal layer and the fourth metal layer included in the gate line,
wherein the source electrode is in contact with a first portion of the semiconductor layer, the drain electrode is in contact with a second portion of the semiconductor layer, and the gate electrode is overlapped with a third portion of the semiconductor layer that is between the first portion of the semiconductor layer and the second portion of the semiconductor layer.

13. The electroluminescence display of claim 12, wherein the light shielding layer includes:
a light shielding area overlapping the semiconductor layer; and
a line area that is separated from the light shielding area, the line area including at least one of a data line and a driving current line.

14. The electroluminescence display of claim 1, wherein the first metal layer and the third metal layer comprise molybdenum-titanium-oxide, and each of the second metal layer and the fourth metal layer include at least one of copper, aluminum, silver, and gold.

15. An electroluminescence display comprising:
a light shielding layer on a substrate, the light shielding layer including a plurality of first reflective layers, wherein light reflected by each of the plurality of first reflective layers have opposite phases such that the light reflected by the plurality of first reflective layers at least partially destructively interfere;
a plurality of buffer layers on the light shielding layer;
a gate insulating layer on the plurality of buffer layers;
a gate line on the gate insulating layer and non-overlapping with the light shielding layer, the gate line including a plurality of second reflective layers, wherein light reflected by each of the plurality of second reflective layers have opposite phases such that the light reflected by the plurality of second reflective layers at least partially destructively interfere;
a passivation layer at least partially covering the gate line;
a planarization layer on the passivation layer; and
an emission element including a first electrode, an emission layer, and a second electrode sequentially arranged on the planarization layer,
wherein the second electrode includes a plurality of cathode layers including:
a first cathode layer on the emission layer;
a second cathode layer on the first cathode layer; and
a third cathode layer on the second cathode layer.

16. The electroluminescence display of claim 15, wherein
the first cathode layer includes a first metal material and a first thickness in a range of 100 Å to 200 Å;
the second cathode layer includes a conductive organic material comprising a domain material and a dopant; and
the third cathode layer includes a second metal material and a second thickness in a range of 2,000 Å to 4,000 Å.

17. The electroluminescence display of claim 15, wherein the plurality of first reflective layers includes a first metal layer and a second metal layer, and the plurality of second reflective layers includes a third metal layer and a fourth metal layer,
wherein the first metal layer and the third metal layer each comprise a metal oxide material and a thickness in a range of 100 Å to 500 Å, and
wherein the second metal layer and the fourth metal layer each comprise a metal material and a thickness in a range of 2,000 Å to 4,000 Å.

18. The electroluminescence display of claim 15, wherein the plurality of buffer layers includes a first buffer layer and a second buffer layer on the first buffer layer, the first buffer layer having a first refractive index, and the second buffer layer having a second refractive index that is different from the first refractive index.

19. The electroluminescence display of claim 18, wherein the first buffer layer comprises silicon nitride having a first refractive index of 1.8, and
wherein the second buffer layer comprises a silicon oxide having a second refractive index of 1.5.

* * * * *